(12) United States Patent
Chartarifsky et al.

(10) Patent No.: US 7,721,430 B2
(45) Date of Patent: May 25, 2010

(54) APPROACH FOR FABRICATING CANTILEVER PROBES

(75) Inventors: Dov Chartarifsky, Chandler, AZ (US); Edward T. Laurent, Ambler, PA (US); Edward L. Malantonio, Conshohocken, PA (US); Richard D. Sadler, Quakertown, PA (US); Bahadir Tunaboylu, Chandler, AZ (US)

(73) Assignee: SV Probe PTE Ltd., Singapore (SG)

( * ) Notice: Subject to any disclaimer, the term of this patent is extended or adjusted under 35 U.S.C. 154(b) by 151 days.

(21) Appl. No.: 11/709,547

(22) Filed: Feb. 21, 2007

(65) Prior Publication Data
US 2007/0256299 A1 Nov. 8, 2007

Related U.S. Application Data

(60) Provisional application No. 60/775,633, filed on Feb. 22, 2006.

(51) Int. Cl.
*H01R 43/00* (2006.01)
(52) U.S. Cl. .............................. 29/884; 29/842; 29/876; 257/693; 324/762
(58) Field of Classification Search .......... 29/842–845, 29/847, 874, 876, 884; 257/48, 693, 696, 257/735; 324/754, 762; 438/14–16, 612, 438/52
See application file for complete search history.

(56) References Cited

U.S. PATENT DOCUMENTS

| | | | |
|---|---|---|---|
| 5,177,438 A * | 1/1993 | Littlebury et al. ........... | 324/754 |
| 6,255,126 B1 * | 7/2001 | Mathieu et al. ............... | 438/15 |
| 6,255,727 B1 * | 7/2001 | Khoury ....................... | 257/693 |
| 6,420,884 B1 * | 7/2002 | Khoury et al. .............. | 324/754 |
| 6,556,269 B1 * | 4/2003 | Takiar et al. ................ | 349/150 |

(Continued)

FOREIGN PATENT DOCUMENTS

WO  WO 03/071289 A1  8/2003

OTHER PUBLICATIONS

European Patent Office, "Notification of Transmittal of the International Search Report and the Written Opinion of the International Searching Authority, or the Declaration", International application No. PCT/US2007/004820, dated Sep. 7, 2007, 13 pages.

(Continued)

*Primary Examiner*—Donghai D. Nguyen
(74) *Attorney, Agent, or Firm*—Hickman Palermo Truong & Becker LLP

(57) ABSTRACT

An approach is provided for fabricating cantilever probes. The approach generally includes using various techniques to secure a cantilever probe in a manner to allow a tip to be created on the cantilever probe. For example, embodiments of the invention include attaching the cantilever probe to a carrier structure by clamping the cantilever probe to the carrier structure, bonding the cantilever probe to the carrier structure via a post feature on the cantilever probe, or applying a material on the carrier structure and substantially around and in contact with the cantilever probe to affix the cantilever probe to the carrier structure. A probe tip can then be formed on the cantilever probe while the cantilever probe is attached or affixed to the carrier structure. The cantilever probe can then be removed and bonded to a probe substrate.

20 Claims, 10 Drawing Sheets

U.S. PATENT DOCUMENTS

| | | | |
|---|---|---|---|
| 6,771,084 B2 * | 8/2004 | Di Stefano | 324/754 |
| 6,777,319 B2 * | 8/2004 | Grube et al. | 438/52 |
| 2001/0054907 A1 | 12/2001 | Beaman et al. | |
| 2002/0089344 A1 * | 7/2002 | Beaman et al. | 324/754 |
| 2003/0113990 A1 * | 6/2003 | Grube et al. | 438/612 |
| 2004/0198081 A1 * | 10/2004 | Eldridge et al. | 439/81 |

OTHER PUBLICATIONS

Claims, International application No. PCT/US2007/004820, 4 pages.

\* cited by examiner

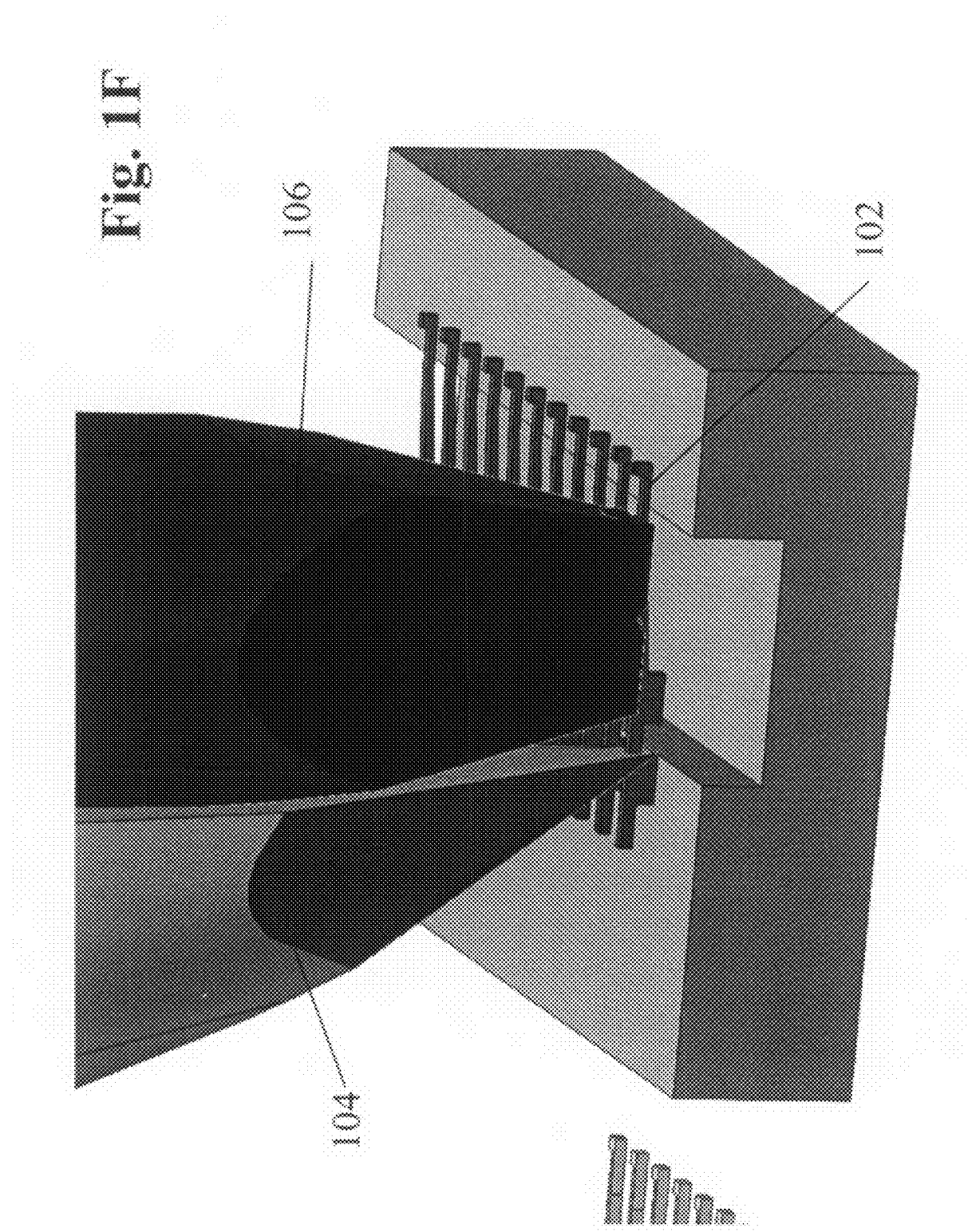

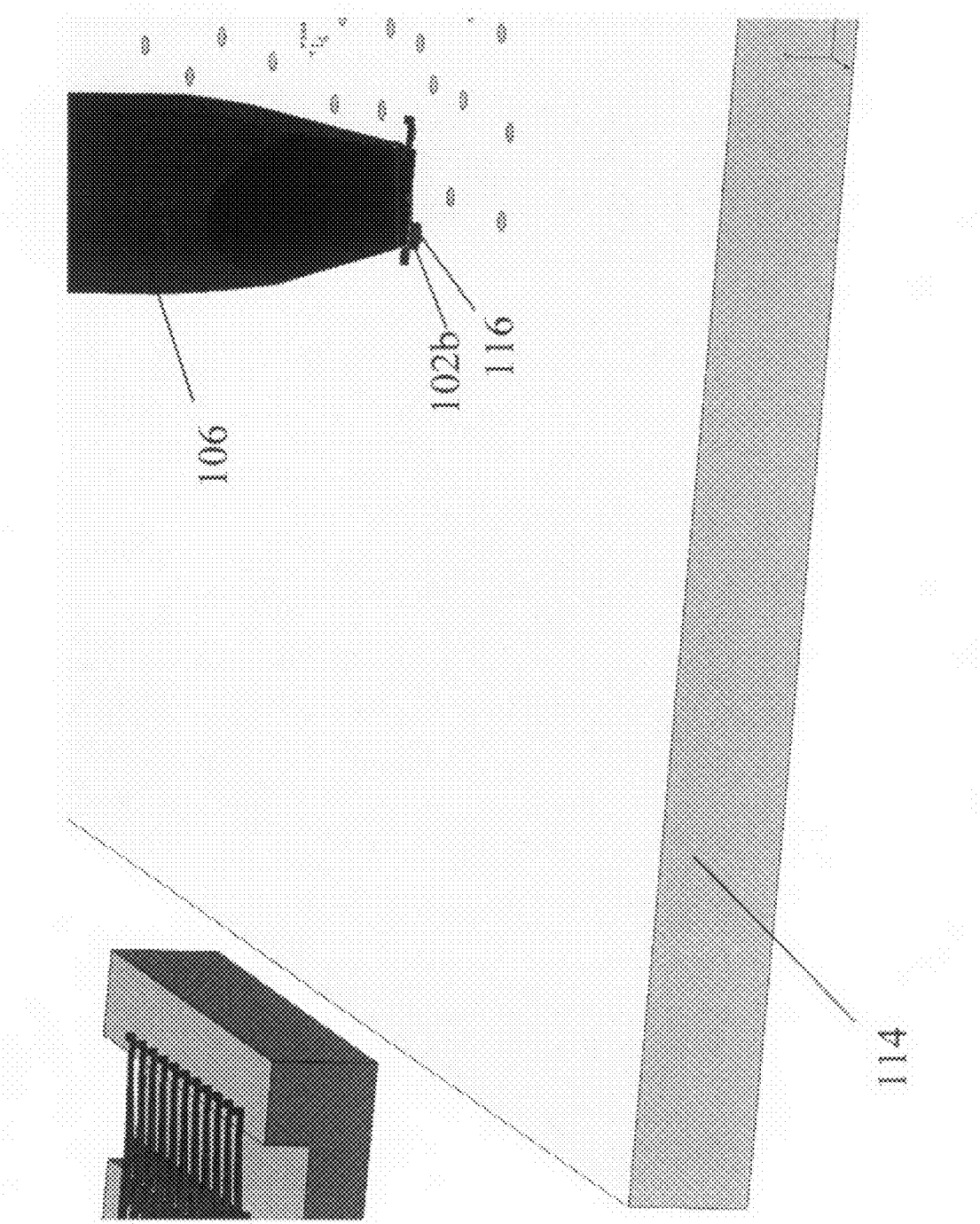

APPROACH FOR FABRICATING CANTILEVER PROBES

RELATED APPLICATION DATA

This application claims the benefit of, and priority to, U.S. Provisional Patent Application No. 60/775,633, entitled Probe Element And Method of Forming The Same, filed Feb. 22, 2006, the contents of which are incorporated by reference for all purposes as if fully set forth herein.

FIELD OF THE INVENTION

This invention relates generally to the fabrication of cantilever probes for probe card assemblies.

BACKGROUND

In the testing of wafer-based semiconductor devices, probe cards are typically used to provide electrical interconnection between a testing system and the semiconductor wafer. Such probe cards may, for example, include a Printed Circuit Board (PCB), a probe substrate and an interposer (e.g., a pogo pin or spring pin based interposer) that provides electrical interconnection between the PCB and the probe substrate. Resilient probe elements are supported by the probe substrate. For example, in certain probe cards, the probe elements may be held in a "floating" configuration within a probe head adjacent the probe substrate. In other probe cards, the probe elements may be fixed at one end to a conductive region (e.g., a conductive trace, a terminal, a lead, a contact pad, etc.) of the probe substrate.

The probe elements may have different configurations depending upon the testing application. For example, cantilever style probes are sometimes used in the testing of memory devices. Such cantilever probes may include (a) a post adjacent a conductive region of the probe substrate, (b) a cantilever beam bonded to the post, and (c) a tip portion positioned adjacent an end of the cantilever beam and configured to probe a contact pad (or the like) of the semiconductor device being tested. There is difficulty in assembling probe cards with probes of these and other types. For example, it may be difficult to achieve a desired planarity with cantilever probes.

BRIEF DESCRIPTION OF THE DRAWINGS

In the figures of the accompanying drawings like reference numerals refer to similar elements.

FIG. 1F depicts a cutting tool cutting the remainder of a probe element from the TAB bonded portion, in conjunction with a tool picking up the remainder of the probe element, according to an embodiment of the invention.

FIG. 1G depicts bonding the remainder of the probe element to a conductive region adjacent a surface of probe substrate using a tool, according to an embodiment of the invention.

DETAILED DESCRIPTION

An approach is provided for fabricating cantilever probes. The approach generally includes using various techniques to secure a cantilever probe in a manner to allow a tip to be created on the cantilever probe. For example, embodiments of the invention include attaching the cantilever probe to a carrier structure by clamping the cantilever probe to the carrier structure, bonding the cantilever probe to the carrier structure via a post feature on the cantilever probe, or applying a material on the carrier structure and substantially around and in contact with the cantilever probe to affix the cantilever probe to the carrier structure. A probe tip can then be formed on the cantilever probe while the cantilever probe is attached or affixed to the carrier structure. The cantilever probe can then be removed and bonded to a probe substrate.

FIGS. 1A-1G are various schematic illustrations depicting a process of making probe elements according to various embodiments of the invention.

Figure 1A:
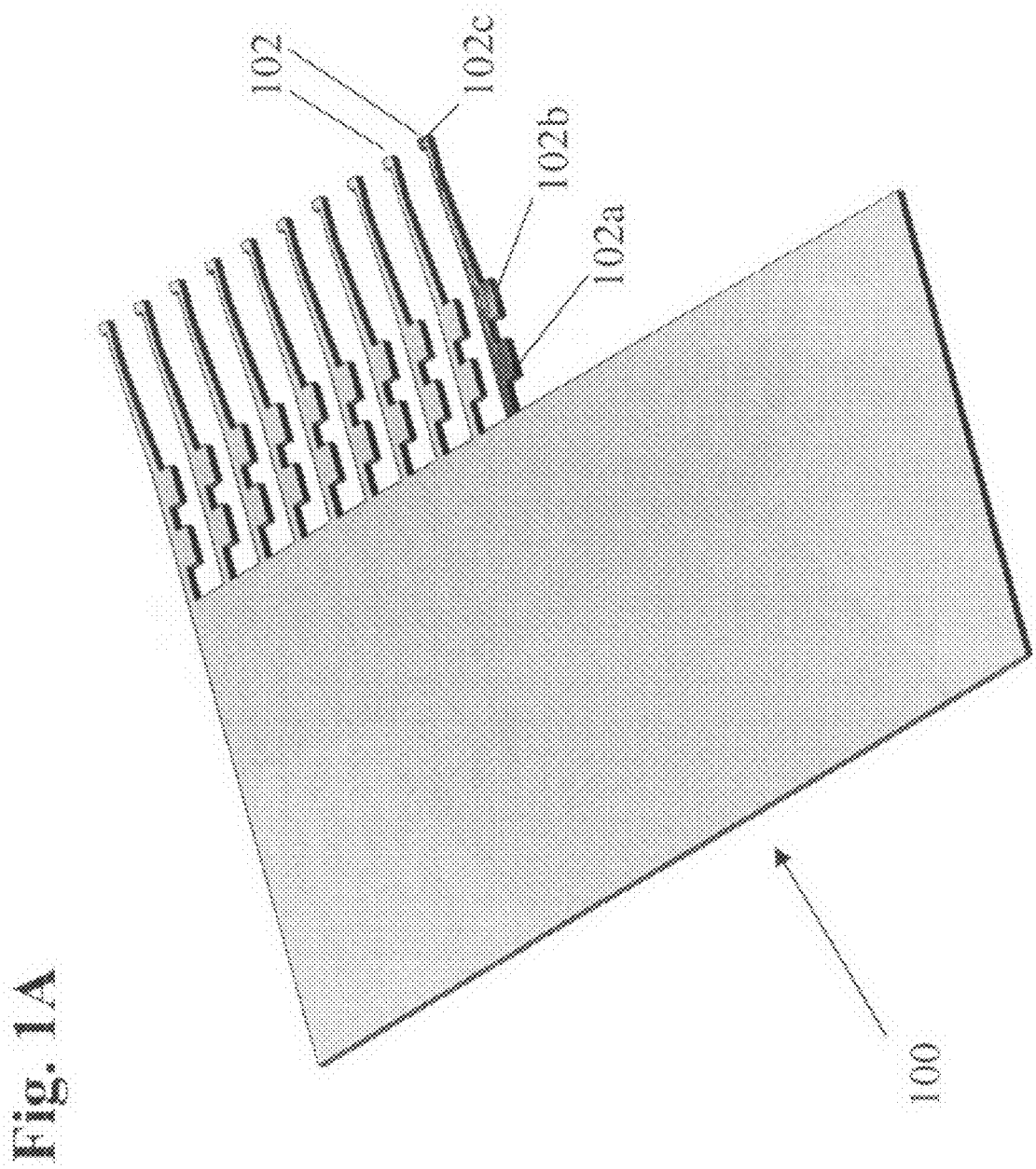
FIG. 1A depicts a probe panel that includes a plurality of probe elements, according to an embodiment of the invention.

FIG. 1A depicts probe panel 100 including a plurality of probe elements 102. Each probe element 102 includes two post portions 102a and 102b (the purpose of which is explained herein) and a raised platform portion 102c. As depicted in FIG. 1A, probe elements 102 are formed as part of probe panel 100 through a process such as, for example, plating using masking techniques (e.g., using lithographic techniques such as photolithography, stereolithography, X-ray lithography, etc.); however, the present invention is not limited thereto, and other methods of forming probe panel 100 (e.g., stamping, etching, laser ablation, etc.) may be used.

Figure 1B:
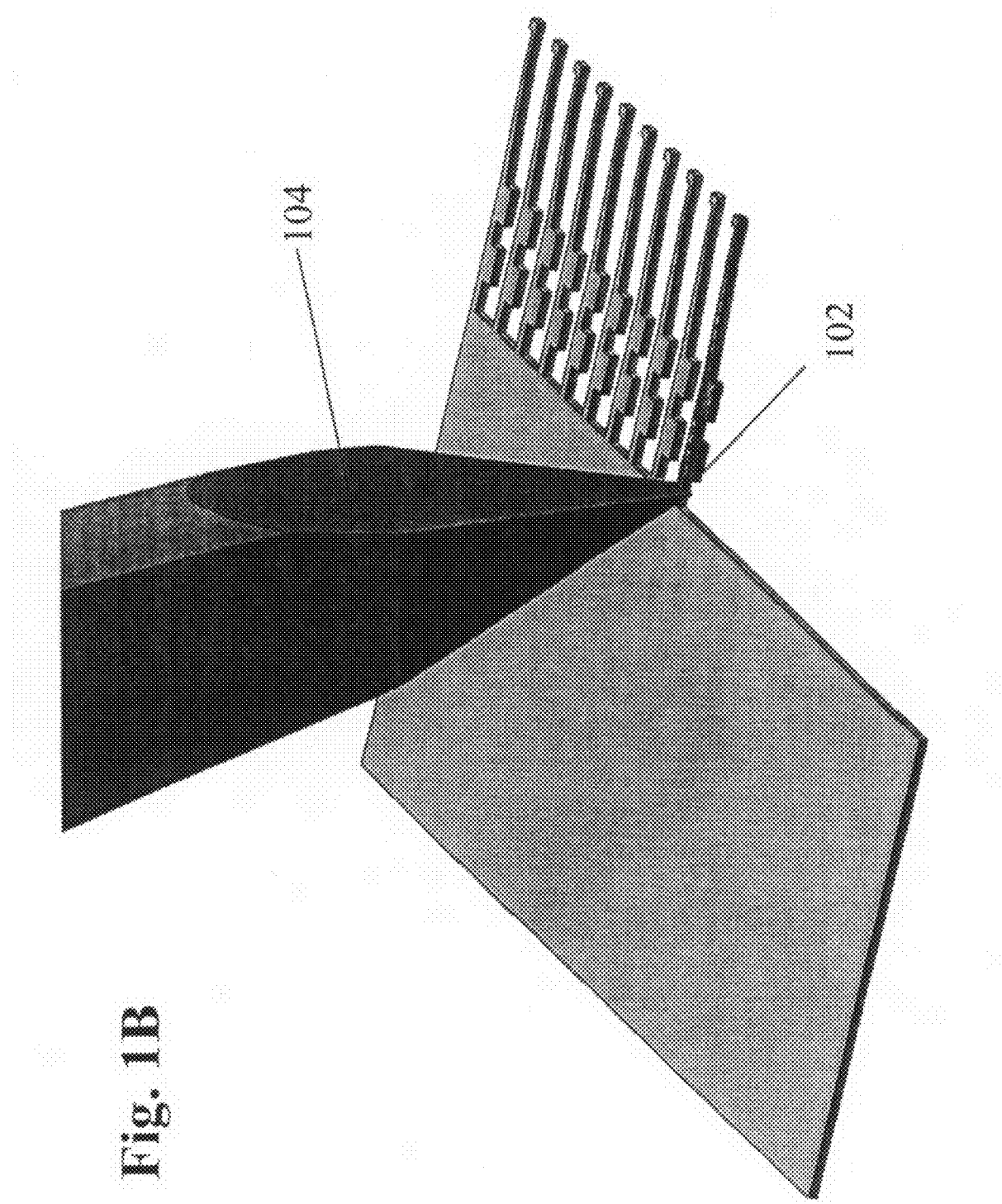
FIG. 1B depicts a cutting tool cutting a probe element from the probe panel depicted in FIG. 1A, according to an embodiment of the invention.
Figure 1C:
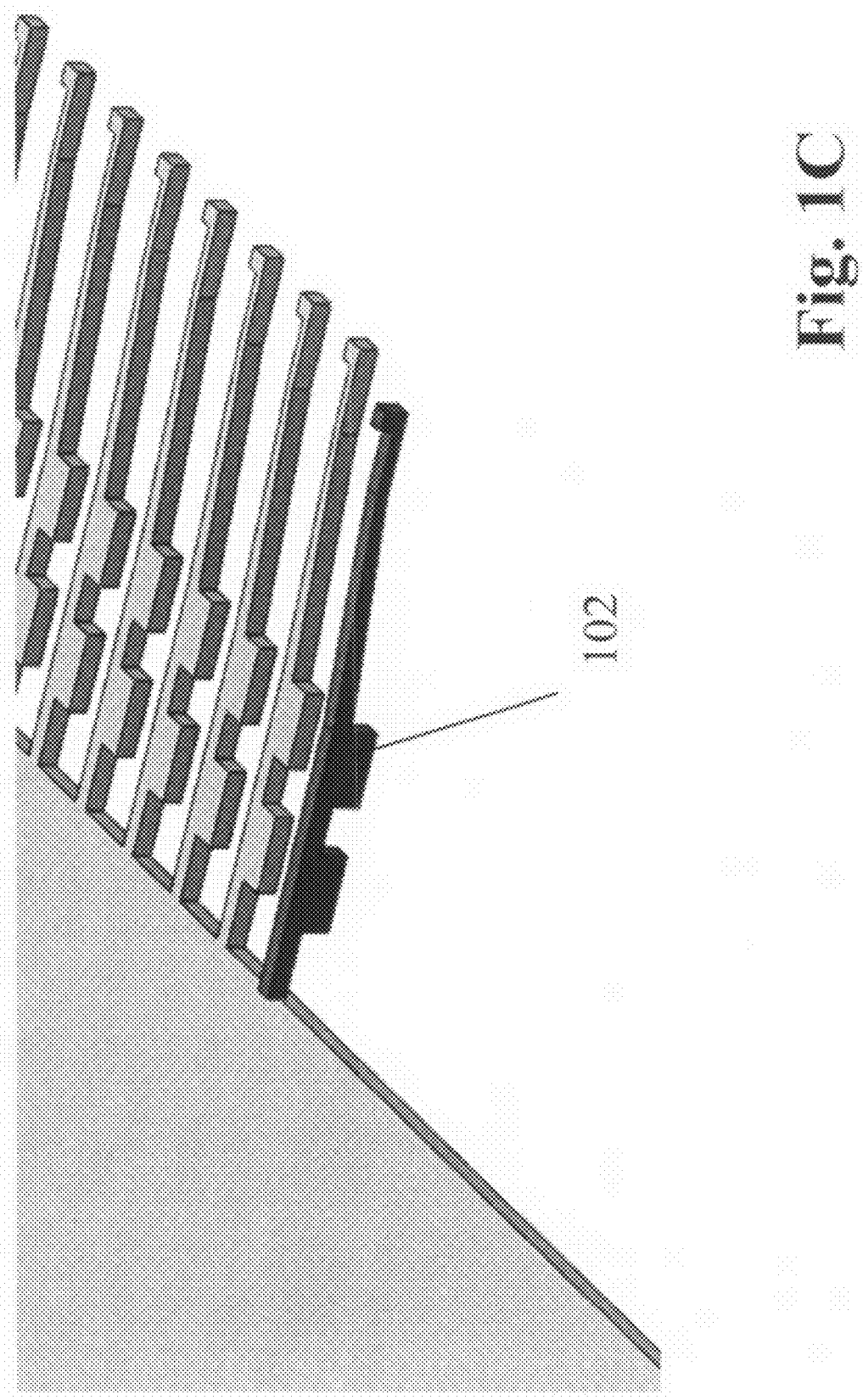
FIG. 1C depicts a singulated probe element that has been rotated 90 degrees from its orientation of formation after being cut from the probe panel depicted in FIG. 1A, according to an embodiment of the invention.
Figure 1D:
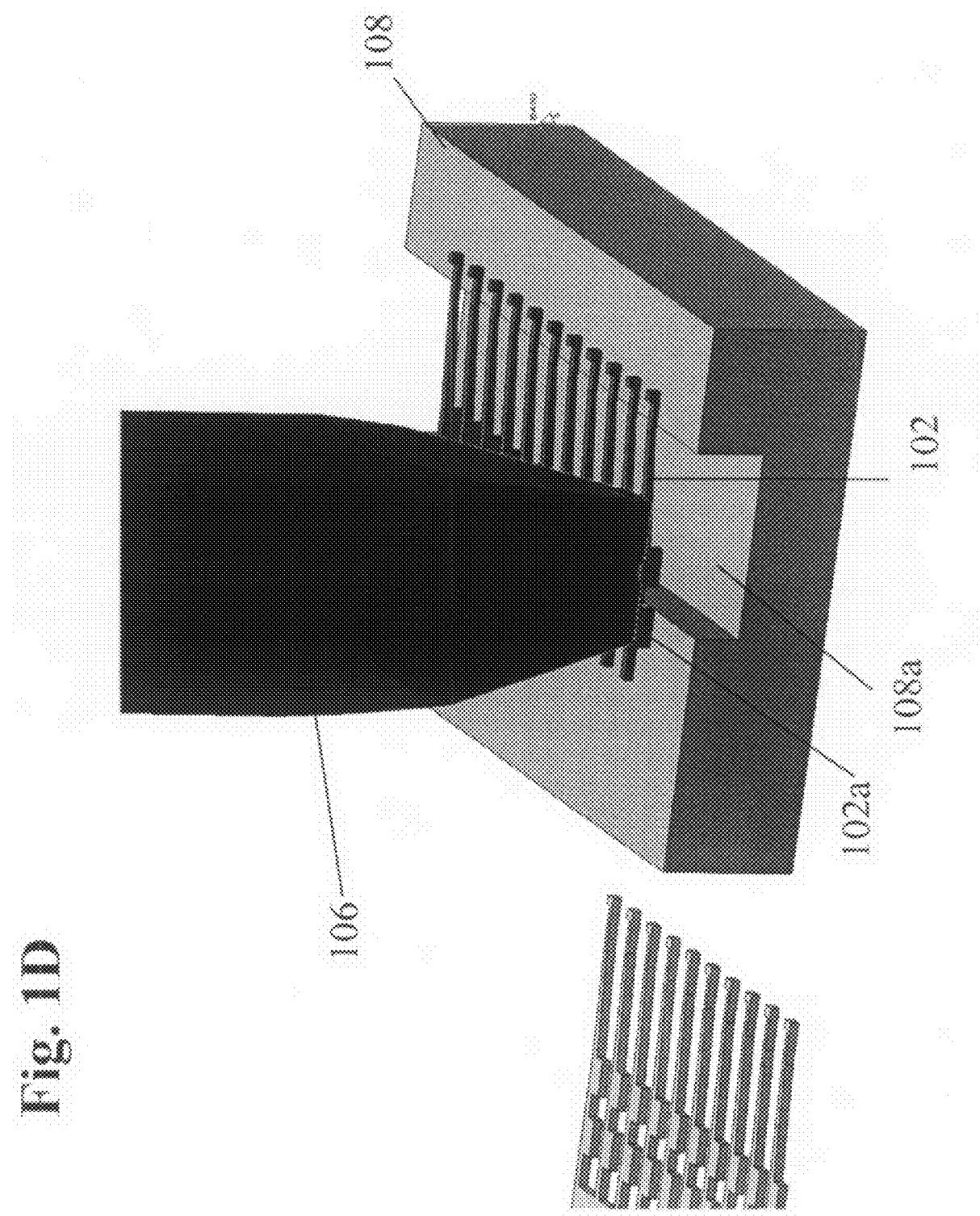
FIG. 1D depicts a tool bonding the singulated probe element depicted in FIG. 1C to a carrier structure, according to an embodiment of the invention.

FIG. 1B depicts cutting tool 104 (e.g., a chopping tool configured to work in conjunction with conventional wire bonding machines) cutting a probe element 102 from probe panel 100. In FIG. 1C, the singulated probe element 102 is rotated 90 degrees from its orientation of formation (i.e., its orientation as part of plated probe panel 100) after being cut from probe panel 100. In FIG. 1D, tool 106 (e.g., a vacuum bonding tool) is used to bond (e.g., via TAB bonding) the singulated probe element 102 to carrier structure 108 having recess 108a. More specifically, probe element 102 is TAB bonded to carrier structure 108 via post portion 102a.

Figure 1E:
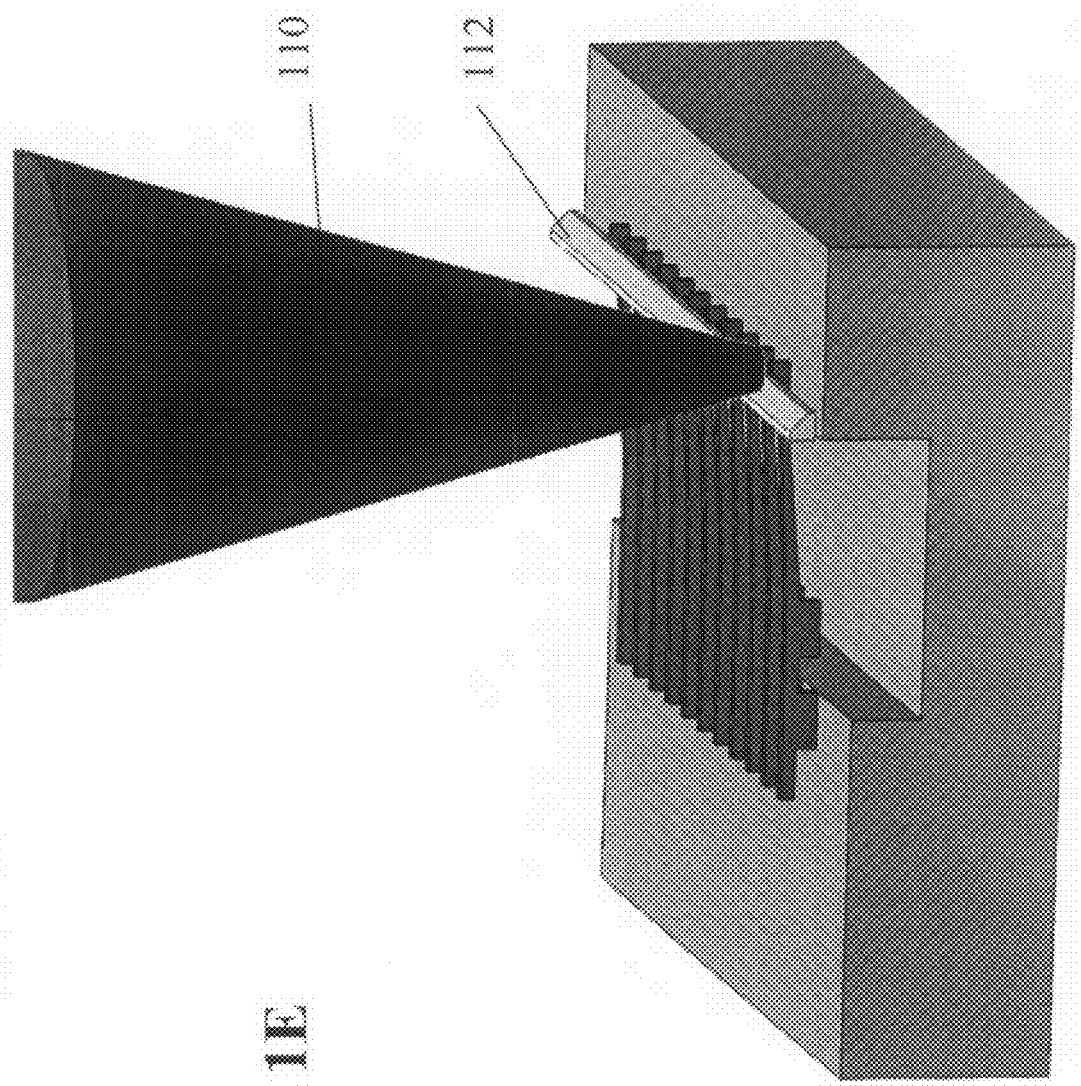
FIG. 1E depicts a portion of a clamping mechanism for holding a plurality of probe elements in position with respect to the carrier structure depicted in FIG. 1D, according to an embodiment of the invention.

FIG. 1E depicts a portion of a clamping mechanism 112 for holding a plurality of probe elements 102 in position with respect to carrier structure 108. Tip forming tool 110 (e.g., a capillary tool configured for use on a wire bonding machine) is bumping tips (not shown) on respective raised platform portions 102c. For example, tips for probe elements 102 may be formed in accordance with the teachings of U.S. patent application Ser. No. 11/211,994 entitled "Stacked Tip Cantilever Electrical Connector," which is hereby incorporated by reference in its entirety. Clamping mechanism 112 is provided to hold probe elements 102 in place during the tip formation operation.

FIG. 1F depicts cutting tool 104 cutting the remainder of probe element 102 from the TAB bonded portion, in conjunction with tool 106 picking up (e.g., using a vacuum) the remainder of probe element 102. The remainder of probe element 102 is bonded (e.g., TAB bonded via post portion 102b) to a conductive region 116 (e.g., a conductive pad or trace) adjacent a surface of probe substrate 114 using tool 106, as depicted in FIG. 1G. For example, probe substrate 114 may be a multi-layer substrate (e.g., a multi-layer ceramic substrate, a multi-layer organic substrate, etc.), and may also be a space transformer. For example, probe substrate 114 may be configured to be part of a probe card including other conventional components such as a PCB and an interposer (not depicted).

Figure 2A:
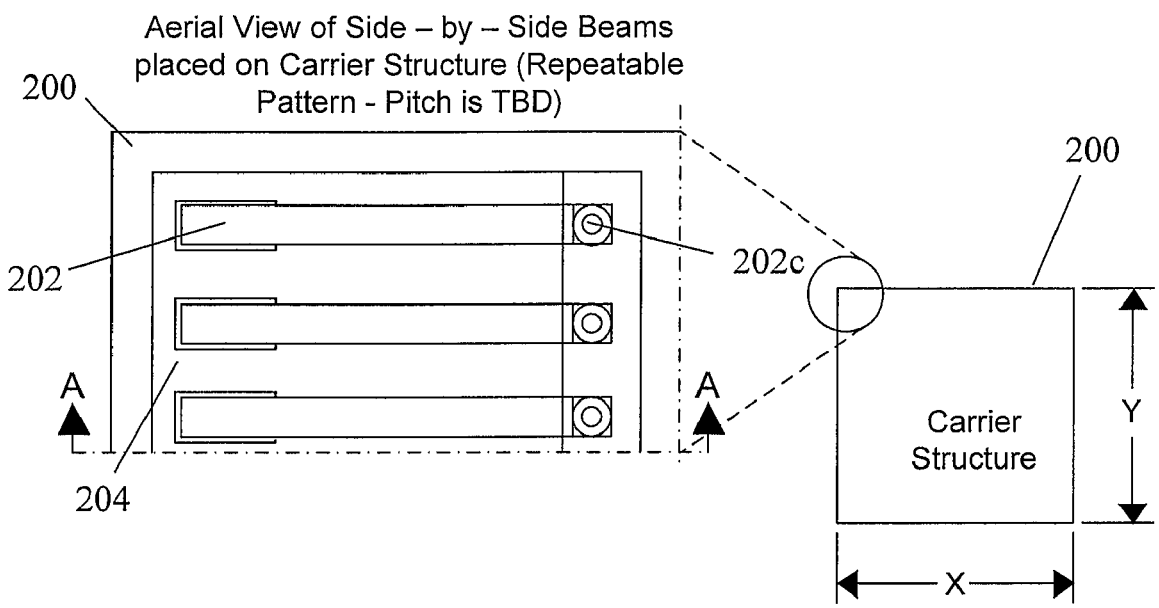
FIG. 2A depicts a carrier plate having an active width and an active depth Y, according to an embodiment of the invention.
Figure 2B:
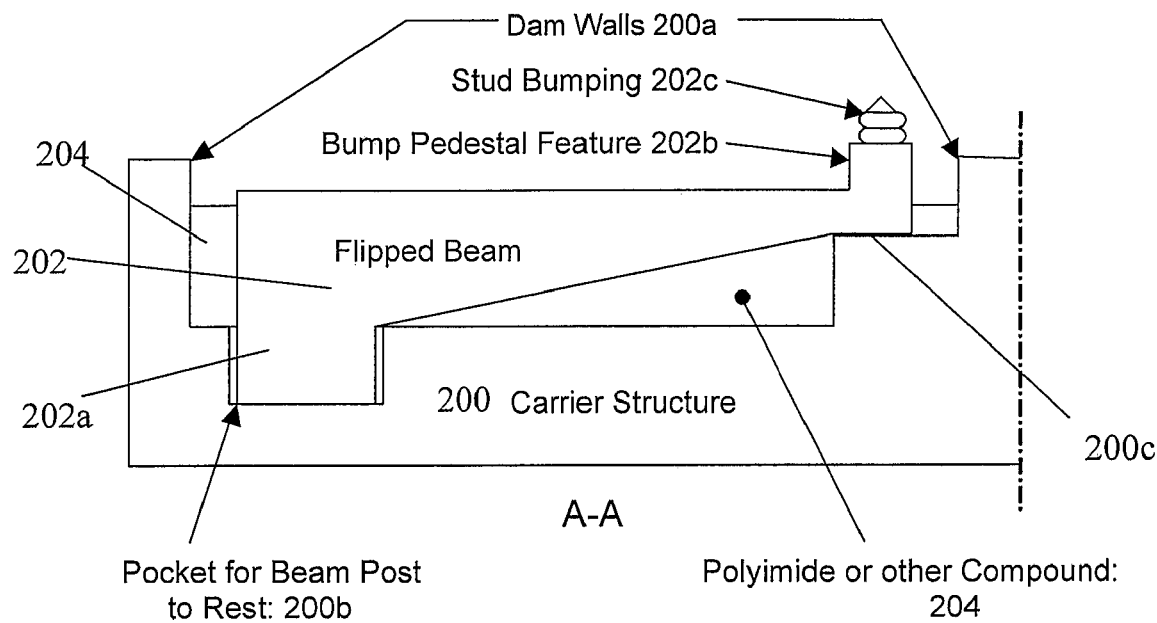
FIG. 2B depicts that the carrier plate of FIG. 2A defines dam walls, a pocket and a surface, according to an embodiment of the invention.

FIGS. 2A-2B depict probe elements 202 that are held in place (e.g., for forming tip portions) according to an embodiment of the invention. Other aspects of the embodiment of FIGS. 2A-2B may be according to the exemplary embodiment of FIGS. 1A-1G, or according to other similar techniques.

FIG. 2A depicts carrier structure 200 (e.g., a re-usable metal carrier plate) having an active width X (e.g., the active width for a pick and place process on a wire bonder, where such process may include TAB bonding and/or tip forming) and an active depth Y. A detailed portion (i.e., the upper left hand portion) of carrier structure 200 is depicted in the left hand portion of FIG. 2A. This is an aerial side view of three probe elements 202 arranged in a side-by-side configuration on carrier structure 200. Material 204 (e.g., a polyimide material or another material that is acid dissolvable) is provided to hold probe elements 202 in place. This is more clearly depicted in FIG. 2B.

As shown in FIG. 2B, carrier structure 200 defines dam walls 200a, a pocket 200b and a surface 200c. Probe element 202 (also referred to as beam 202) is positioned with respect to carrier structure 200 such that beam post 202a rests in pocket 200b, and such that the lower surface of pedestal feature 202b rests against surface 200c. Thus, carrier structure 200 acts as a platform for tip formation (e.g., a platform for stud bumping).

Material 204 (e.g., a polyimide material or another material that is acid dissolvable) is provided to hold probe elements 202 in place during formation (e.g., stud bumping) of tip portion 202c on pedestal feature 202b. As shown in FIG. 2B, dam walls 200a contain material 204, which may be applied in a liquid form.

Figure 3:
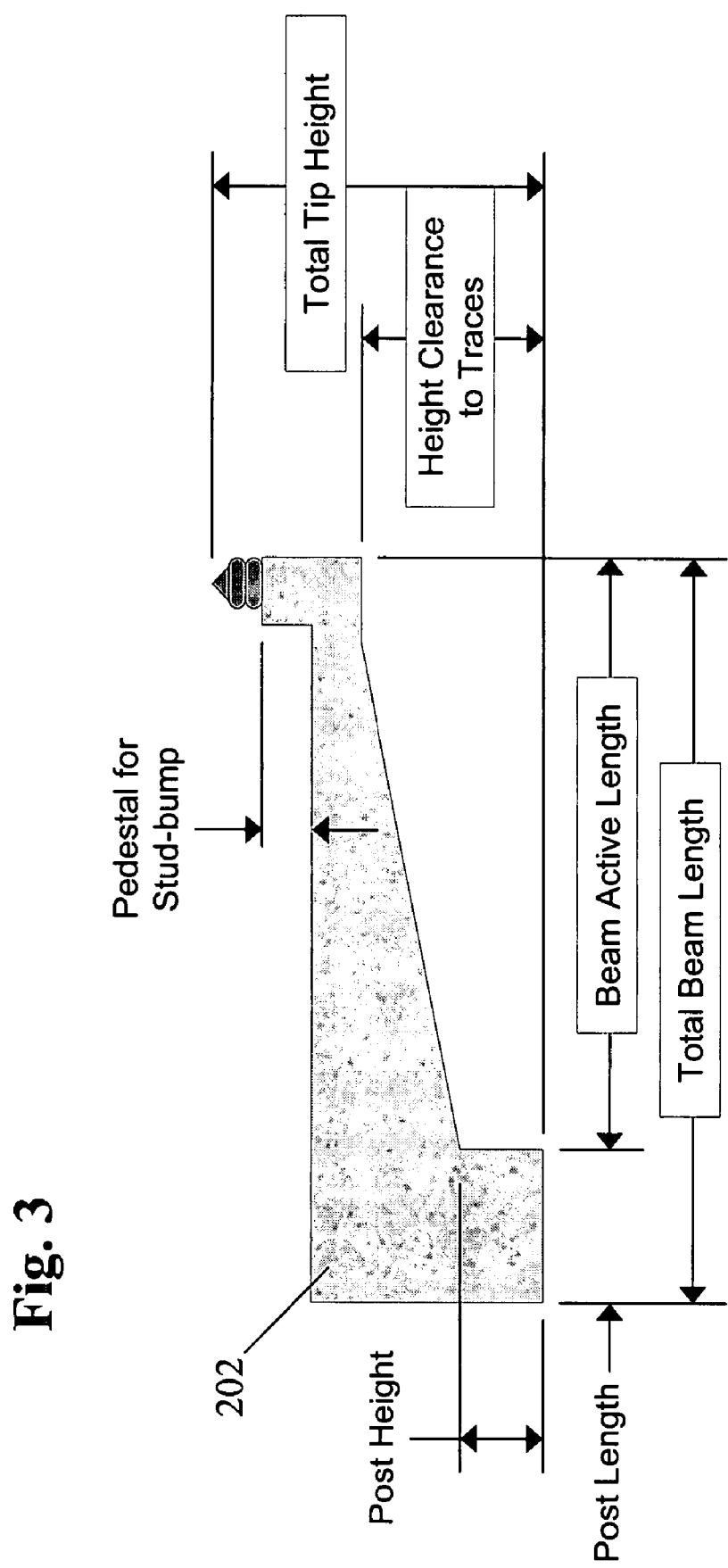
FIG. 3 depicts a probe element after being removed from the carrier plate depicted in FIG. 2A, according to an embodiment of the invention.

FIG. 3 depicts probe element 202 removed from carrier structure 200 (e.g., after material 204 has been dissolved using, for example, acid or the like). Probe element 202 may be picked up (e.g., using a vacuum tool such as tool 106, and bonded (e.g., TAB bonded) using a tool (e.g., using a bonding tool such as tool 106) to a conductive region of a probe substrate.

The teachings of the present invention are particularly applicable to cantilever style probe elements used in the testing of certain memory devices. For example, by forming (e.g., plating) a probe element on its side, and then rotating it 90 degrees, more complex geometries can be accomplished in the plating operation. The 90 degree orientation of the probe elements (i.e., rotation after being cut from the probe panel) may be accomplished using, for example, a vibratory feed system, a shaker plate, a robotic tool, a vacuum tool, etc. (not depicted). Other rotation amounts may be used, depending upon a particular implementation and the invention is not limited to rotations of 90 degrees.

The carrier structures discussed herein may be a re-usable metal structure which may be fabricated on using electrically controlled machining (e.g., a CNC machining process) to suit the specific probe elements. For example, pockets, apertures, and surfaces (e.g., see pocket 200b and surface 200c in FIG. 2B) may be machined via an EDM (i.e., electro-discharge machining) process.

According to the present invention, and alternatives thereof, operations including formation of probe elements, cutting the probe elements away from a probe panel, picking up of the probe elements, TAB bonding them to a carrier structure, stud bumping a tip structure, picking up the probe element including tip structure, and TAB bonding of the probe element to a probe substrate, may be automated.

Although the invention is depicted and described herein with reference to specific embodiments, the invention is not intended to be limited to the details shown. Rather, various modifications may be made in the details within the scope and range of equivalents of the claims and without departing from the invention.

What is claimed is:

1. A method for fabricating a probe for a probe card assembly, the method comprising:
   removing the probe from a probe panel having a plurality of probes attached thereto by mechanically cutting the probe from the probe panel using a cutting tool;
   after removing the probe from the probe panel, attaching the probe to a carrier structure;
   while the probe is attached to the carrier structure, forming a tip on a raised platform portion of the probe;
   removing the probe from the carrier structure; and
   bonding the probe to a probe substrate.

2. The method as recited in claim 1, wherein:
   the probe includes a first post feature and a second post feature, the attaching the probe to the carrier structure includes bonding the probe to the carrier structure via the first post feature, and
   the bonding the probe to the probe substrate includes bonding the probe to the probe substrate via the second post feature.

3. The method as recited in claim 2, wherein:
   the removing the probe from the carrier structure includes cutting the probe into a first portion and a second portion and removing the second portion from the carrier structure, wherein the first portion includes the first post feature and the second portion includes the second post feature and the raised platform portion of the probe, and
   the bonding the probe to the substrate via the second post feature includes bonding the second portion of the probe to the substrate via the second post feature.

4. The method as recited in claim 3, wherein after removing the second portion from the carrier structure the first portion remains bonded to the carrier structure.

5. The method as recited in claim 2, further comprising clamping the probe to the carrier structure.

6. The method as recited in claim 1, further comprising after removing the probe from the probe panel having a plurality of probes attached thereto and prior to attaching the probe to a carrier structure, rotating the probe to a different orientation than the orientation of the probe prior to being removed from the probe panel.

7. The method as recited in claim 1, wherein the attaching the probe to the carrier structure includes bonding the probe to the carrier structure using TAB bonding.

8. The method as recited in claim 1, wherein the attaching the probe to the carrier structure includes clamping the probe to the carrier structure.

9. The method as recited in claim 1, wherein:
the substrate includes a conductive region, and
the bonding the probe to the substrate includes bonding the probe to the conductive region of the substrate.

10. The method as recited in claim 1, wherein the bonding the probe to the conductive region of the substrate includes bonding the probe to the conductive region of the substrate using TAB bonding.

11. The method as recited in claim 1, wherein the substrate comprises one or more of a multi-layer ceramic, an organic substrate or a space transformer.

12. The method as recited in claim 1, wherein:
the removing the probe from the carrier structure includes removing the probe from the carrier structure using a tool that utilizes a vacuum, and
the method further comprises prior to bonding the probe to the probe substrate, using the tool that utilizes the vacuum to position the probe in contact with the probe substrate.

13. The method as recited in claim 1, wherein the forming a tip on a raised platform portion of the probe includes using a tip forming tool to create a stacked tip on the raised platform portion of the probe.

14. The method as recited in claim 1, wherein said removing the probe is performed by mechanically dry cutting the probe from the probe panel using the cutting tool.

15. A method for fabricating a cantilever probe for a probe card assembly, the method comprising:
affixing the cantilever probe to a carrier structure, wherein the cantilever probe includes a first end and a second end, a post element at the first end of the cantilever probe and a tip pedestal feature at the second end of the cantilever probe, and wherein the carrier structure includes a pocket feature shaped to receive the post element and a surface for supporting the second end of the cantilever probe;
while the probe is affixed to the carrier structure, forming a tip on the tip pedestal feature at the second end of the cantilever probe; and
removing the cantilever probe from the carrier structure.

16. The method as recited in claim 15, wherein:
the affixing the cantilever probe to the carrier structure includes applying a layer of material on the carrier structure and substantially around and in contact with the cantilever probe, and
the method further comprises prior to removing the removing the cantilever probe from the carrier structure, removing at least a portion of the material.

17. The method as recited in claim 16, wherein:
the layer of material is applied to the carrier structure in liquid form, and
the carrier structure includes one or more wall features for containing the layer of material when applied to the carrier structure in liquid form.

18. The method as recited in claim 16, wherein the removing at least a portion of the material includes removing at least a portion of the material by dissolving the at least a portion of the material.

19. The method as recited in claim 16, wherein the material is a polymide.

20. The method as recited in claim 15, wherein the forming a tip on the tip pedestal feature at the second end of the cantilever probe includes using a tip forming tool to create a stacked tip on the tip pedestal feature at the second end of the cantilever probe.

* * * * *